(12) United States Patent
Laufer et al.

(10) Patent No.: US 6,654,244 B2
(45) Date of Patent: Nov. 25, 2003

(54) DEVICE FOR THE COOLING OF COMPONENTS

(75) Inventors: Martin Laufer, Hasloch (DE); Ute Riedl, Solms/Oberndorf (DE)

(73) Assignee: Siemens Aktiengesellschaft, München (DE)

( * ) Notice: Subject to any disclaimer, the term of this patent is extended or adjusted under 35 U.S.C. 154(b) by 0 days.

(21) Appl. No.: 10/021,897

(22) Filed: Dec. 17, 2001

(65) Prior Publication Data

US 2002/0114138 A1 Aug. 22, 2002

(30) Foreign Application Priority Data

Dec. 21, 2000 (DE) .......................... 100 63 874

(51) Int. Cl.⁷ ................................. H05K 7/20
(52) U.S. Cl. .............. 361/695; 165/80.3; 361/719; 361/818
(58) Field of Search .................. 361/690–695, 361/717–719, 816, 818; 165/80.3, 121–126, 908; 454/184; 415/213.1, 214.1; 174/35 R, 51, 16.1; 439/607

(56) References Cited

U.S. PATENT DOCUMENTS

| 3,592,260 A | 7/1971 | Berger |
| 5,473,507 A | 12/1995 | Schwegler |
| 5,493,473 A | 2/1996 | Yanagi |
| 5,689,403 A | 11/1997 | Robertson, Jr. |

FOREIGN PATENT DOCUMENTS

DE 7910180 4/1979

Primary Examiner—Gerald Tolin
(74) Attorney, Agent, or Firm—Martin A. Farber

(57) ABSTRACT

For the cooling of electronic components on a board (2) which is located within an (EMC) shield (3), the shield (3) lying within a housing (1), a part air stream of a fan (5) in the housing wall is guided into the shield (3) by an air guide duct (13). Cooling is highly effective, and known heat-conducting elements between the components (4) and the shield (3) are dispensible.

14 Claims, 2 Drawing Sheets

DEVICE FOR THE COOLING OF COMPONENTS

FIELD AND BACKGROUND OF THE INVENTION

The invention relates to an arrangement for the cooling of electronic components on a board which is embedded into a metallic shield for protection against electromagnetic radiation.

Electronic components, in particular highly integrated circuits, when in operation, generate heat which has to be discharged so that the components are not destroyed. For this purpose, the air which heats up in the housing in which these components are located is continuously replaced by cooler ambient air by means of a fan. This method is not altogether sufficient when the board having the components is also provided with a metallic shield within the housing in order to ensure electromagnetic compatibility (EMC). Such direct shielding is necessary even in the case of metallic housings which also per se give rise to a certain amount of shielding. This alone is not sufficient, however, since, as a rule, a housing has a large number of orifices for feed lines and operating elements, and the electromagnetic radiation can penetrate through these orifices. To be precise, in order to be fully effective, the metallic shield must be sufficiently leaktight, that is to say it should not have any overly large orifices. However, such a leaktight shield arranged directly on the board also has the result that the air between the board and the shield does not participate in the general air exchange in the housing and consequently the heat discharge is reduced.

It has therefore already been proposed to place a heat-conducting cushion between the components to be cooled and the shield, so that the heat generated by the component is transmitted to the shield which, in turn, is cooled by the air stream sweeping past from outside.

SUMMARY OF THE INVENTION

The invention is based on the problem of improving in a simple way the cooling of components on a board within a shield.

For this purpose, it is proposed that, in an arrangement for cooling according to the introductory-mentioned type, the shield has at least one air inlet orifice and at least one air outlet orifice, the first-mentioned orifice being connected to a fan via an air guide duct.

With regard to a shield consisting of two decks which run parallel to and at a short distance from the board and which are connected to one another via side walls to form a largely closed box, an optimal and low-friction distribution of the air stream over the board surface is achieved when the air inlet orifice and the air outlet orifice are formed in the side walls.

Components to be cooled are often arranged on both sides of the board. In such a case, it is advantageous if the air guide duct has two part ducts, one part duct leading into the space between one side of the board and the shield and the other part duct leading into the space between the other side of the board and the shield.

The shield often consists of metal plates, the portions of the side wall on one side of the board having tabs which are inserted through holes located near to one another in the board and which are frictionally and positively connected to corresponding tabs of the shield on the other side of the board. Part of the board, in this case, extends beyond the shield. Particularly in this form of construction, it is appropriate for a component which forms the air guide duct to be slipped onto this portion of the board. For this purpose, the component has a slot in which the board is inserted, said board thereby at the same time forming, if appropriate, a partition between the two part ducts.

There are also shields which consist of a metallized plastic. In such a case, it is appropriate for the air guide duct to be formed in one piece with the shield. The advantage of this is that the shield and the air guide duct can be produced in one operation and be placed simultaneously on the board. In an actual version, there is provision for the shield to consist of two shallow metallized half troughs which are arranged on both sides of the board, and for the air guide duct to be formed by two half shells which are in each case connected in one piece to a half trough.

A fan used typically for the cooling of electronic components consist of a frame, in the center of which is arranged a fan motor which drives a fan wheel, the blades of which run in an annular free space between the frame and the fan motor. Such a fan is located directly in front of the entrance of the air guide duct, only part of the free space being covered. The result of this is that that part of the air stream which is sucked through the noncovered part of the free space enters the housing and cools further components there outside the shield. A single fan can thereby be used both for air exchange in the shield and for air exchange in the housing.

That region of the free space which is covered by the entrance of the air guide duct serves for ventilating the space within the shield. So that the two part spaces above and below the board are supplied approximately with the same air quantity, care must be taken to ensure that the overlaps of the cross-sectional surfaces of the entrances of the part ducts with the cross-sectional surface of the free space are of approximately equal size.

Preferably, the fan is fastened in or on an orifice in the wall of a housing which receives the board, together with the shield, and further, in particular mechanically operating components, the free space, not covered by the air guide duct, of the fan serving for cooling these further components.

The invention will be illustrated in more detail below by means of an exemplary embodiment. For this purpose,

DETAILED DESCRIPTION OF THE PREFERRED EMBODIMENT

Figure 1:
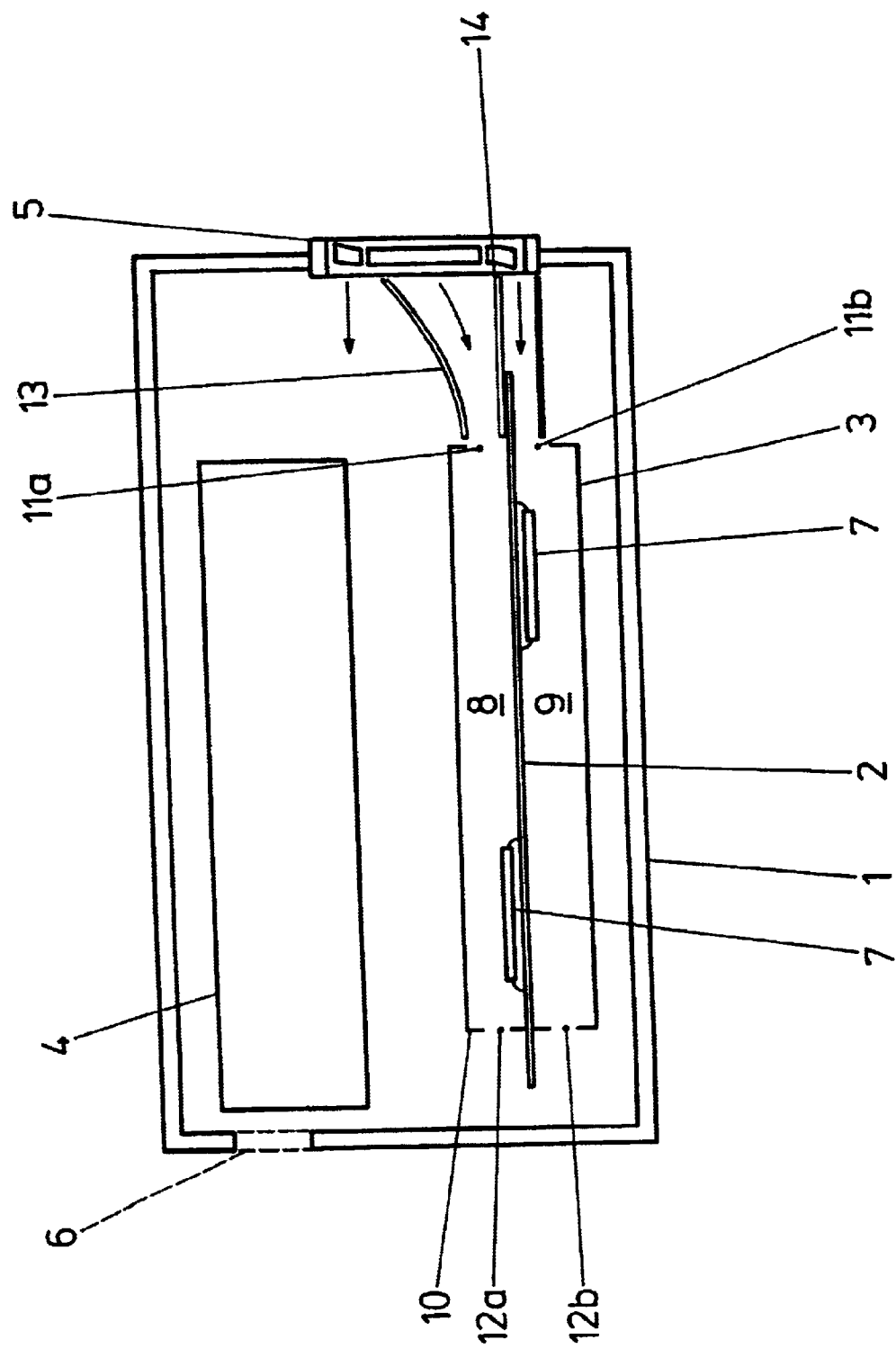
FIG. 1 shows a section through a housing with a board in a shield, with a fan and with an air guide duct.

Reference is first made to FIG. 1: a board 2 is located in the lower part of the housing 1 within a shield 3. Located above it is, for example, a CD player 4 which is indicated here merely diagrammatically. A fan 5 is fastened in the rear wall of the housing 1. In the housing wall are located a plurality of orifices, such as, for example, an introduction slot 6 for introducing a CD. The size and number of the orifices do not make it possible to use the housing itself, even though it consists of metal, as an EMC shield. The board 2 therefore lies, at least with the regions carrying the sensitive components 7, within the (EMC) shield 3 which has as few orifices as possible, and then also only small ones.

In order to ventilate according to the invention the part spaces 8, 9 within the shield 3 above and below the board 2, the side walls 10 of the shield 3 have inlet and outlet orifices 11a, 11b, 12a, 12b. Connected to the inlet orifices 11a, 11b is an air guide duct 13 which bridges the distance between the side wall 10 and the fan 5 in the rear wall of the housing 1. The inlet orifice of the air guide duct does not completely cover the fan, but leaves a part free, so that part of the air quantity sucked in by the fan 5 enters the interior of the housing 1.

Figure 2:
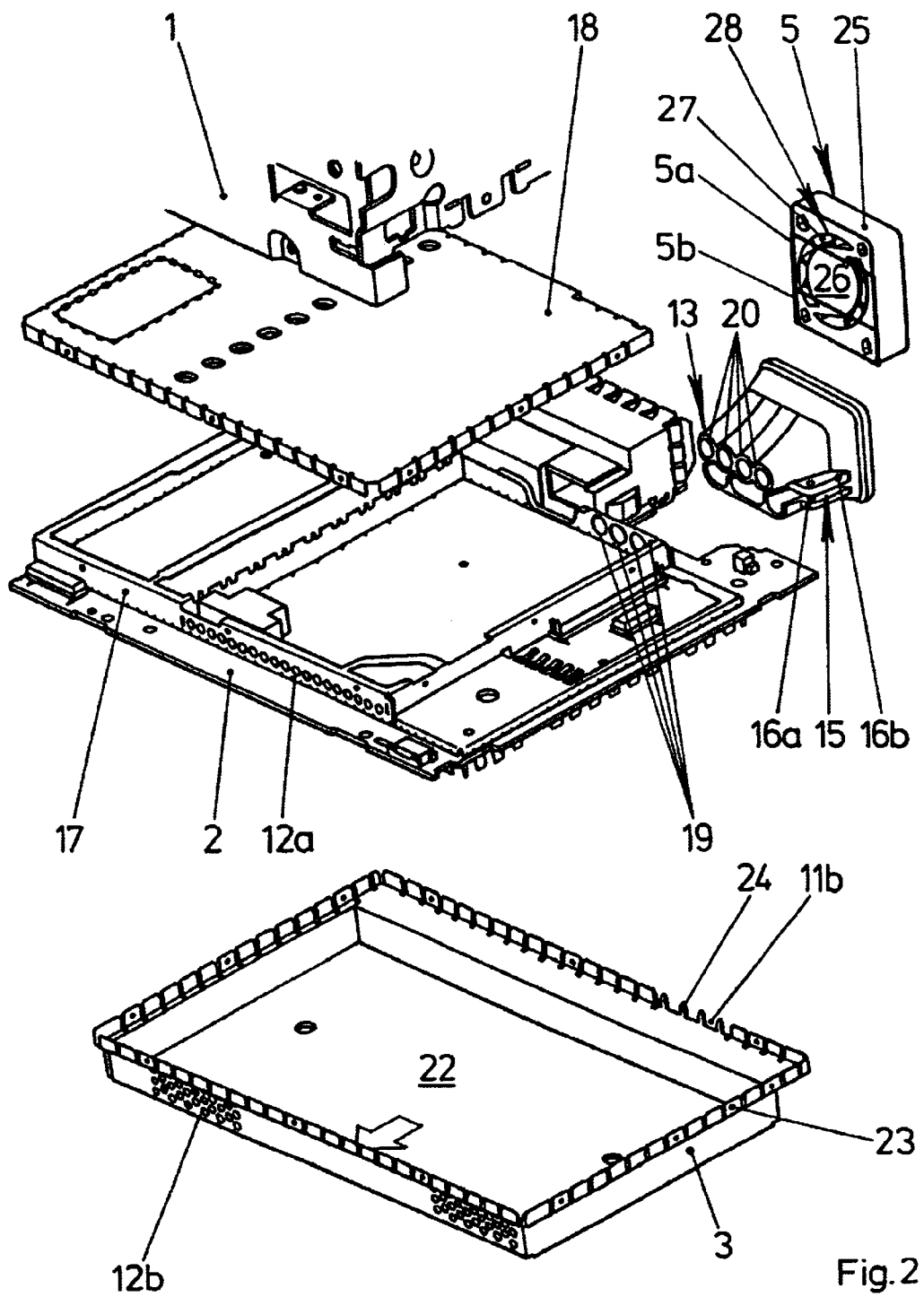
FIG. 2 shows an actual version in an exploded illustration.

As may be gathered from the illustration of the fan 5 and of the air guide duct 13 in FIG. 2, the entrance cross section of the air guide duct 13 is rectangular, with the result that about ⅔ of the fan 5 is covered. The height of the air guide duct 13 decreases toward the shield 3 in that the upper wall of the air guide duct 13 has a descending profile. Located within the air guide duct is a partition 14 which runs horizontally, that is to say parallel to the board, and which divides the air guide duct into two part ducts with different entrance cross sections, of which the projections onto the fan are illustrated as rectangles 5a, 5b. The cross-sectional surface of the entrance of the upper part duct is admittedly approximately twice as large as that of the entrance of the lower part duct. Nevertheless, an air quantity of equal size enters both part ducts, since the regions in each part duct which are swept by the fan blades 27 are of equal size.

Below the partition 14, the air guide duct 13 has located in it a slot 15 which makes it possible to slip said air guide duct onto the board 2. Moreover, above and below the slot 15 is located in each case a wing 16a, 16b with screw holes which match with a hole in the board 2, so that the air guide duct 13 can be screwed to the board 2.

FIG. 2 shows, as a whole, an exploded illustration of a board 2 with a shield 3 and with an arrangement for ventilation.

The board 2 carries electronic components (which are not shown in this illustration) in its middle region surrounded by a metal frame 17 which forms the side wall 10 of the shield 3 above the board 2. This frame 17 is closed by a deck 18. Four round holes 19 are located on that side of the frame 17 which faces the rear wall of the housing 1, as inlet orifices 11a which match with correspondingly shaped exits 20 of the upper part duct. Located on the opposite side are a multiplicity of smaller holes, as outlet orifices 12a, the total cross-sectional surface of which corresponds to the total cross-sectional surface of the inlet orifices.

A multiplicity of tabs, which cannot be seen in the illustration, engage through orifices in the board 2 and project on the other side of the board. The other half of the shield is a sheet-metal trough 22, the edge of which is likewise provided with tabs 23 which are connected positively and frictionally to the inserted tabs, so that a closed shield 3 is formed. To form the inlet orifices 11b for the lower part duct, some tabs 24 are made narrower than the others, so that the distance between them is greater. The outlet orifices 12b, in turn, are represented by a multiplicity of small holes.

The upper margin of the figure illustrates a part of the housing 1 which receives the board 2 together with the shield 3 and in the rear wall of which the fan 5 is located. The latter consists of a frame 25, in the center of which a fan motor 26 is mounted. The blades 27 of the fan are fastened directly to the rotor and run in an annular free space 28 between the frame 25 and the fan motor 27.

In accordance with further aspects of the invention, the following features are noted. The shield 3 consists of a metallized plastic, and the air guide duct is formed in one piece with the shield 3. The shield 3 consists of two shallow half troughs which are arranged on both sides of the board 2, and the air guide duct 13 is formed by two half shells which are in each case connected in one piece to a half trough.

We claim:

1. An arrangement for cooling of electronic components on a board, said arrangement comprising the board embedded into a metal shield for protection against electromagnetic radiation, wherein the shield (3) has at least one air inlet orifice (11a, 11b) and at least one air outlet orifice (12a, 12b), the first-mentioned orifice being connected to a fan (5) via an air guide duct (13), and wherein the air guide duct (13) has two part ducts, one part duct leading into a space between one side of the board (2) and the shield (3) and the other part duct leading into a space between an other side of the board (2) and the shield (3), and wherein the two part ducts are separated by a partition (14) that extends from the fan.

2. The arrangement for cooling as claimed in claim 1, wherein the shield (3) is made of two decks (18) which run parallel to and at a short distance from the board and which are connected to one another via side walls (10) to form a largely closed box, and wherein the orifices (11a, 11b; 12a; 12b) are formed in the side walls (10).

3. The arrangement for cooling as claimed in claim 1, wherein a component forming the air guide duct (13) is located on a portion of the board (2) which projects laterally from the shield (3).

4. The arrangement for cooling as claimed in claim 1, wherein the shield (3) is made of a metallized plastic, and wherein the air guide duct (13) is formed in one piece with the shield (3).

5. The arrangement for cooling as claimed in claim 4, wherein the shield (3) is made of two shallow half troughs which are arranged on both sides of the board (2), and wherein the air guide duct (13) is formed by two half shells which are in each case connected in one piece to a half trough.

6. The arrangement for cooling as claimed in claim 1, wherein the fan (5) comprises a frame (25), in a center of which is arranged a fan motor (26) which drives a fan wheel, blades (27) of which run in an annular free space (28) between the frame (25) and the fan motor (26), entrance of the air guide duct (13) being located directly in front of the fan (5) and covering only part of the free space (28).

7. The arrangement for cooling as claimed in claim 6, wherein overlaps of cross-sectional surfaces of the entrances of the two part ducts of the air guide duct (13) with the cross-sectional surface of the free space (28) are of approximately equal size.

8. The arrangement for cooling as claimed in claim 6, wherein the fan is fastened in or on an orifice in a wall of a housing (1) which receives the board (2), together with the shield (3) and further mechanically operating components (4), and wherein the free space (28), not covered by the air guide duct (13), of the fan (5) serves for cooling said further components (4).

9. The arrangement for cooling as claimed in claim 2, wherein the shield (3) is made of a metallized plastic, and wherein the air guide duct (13) is formed in one piece with the shield (3).

10. The arrangement for cooling as claimed in claim 9, wherein the shield (3) is made of two shallow half troughs which are arranged on both sides of the board (2), and wherein the air guide duct (13) is formed by two half shells which are in each case connected in one piece to a half trough.

11. The arrangement for cooling as claimed in claim 2, wherein the fan (5) comprises a frame (25), in a center of which is arranged a fan motor (26) which drives a fan wheel, blades (27) of which run in an annular free space (28) between the frame (25) and the fan motor (26), entrance of the air guide duct (13) being located directly in front of the fan (5) and covering only part of the free space (28).

12. The arrangement for cooling as claimed in claim 11, wherein overlaps of cross-sectional surfaces of the entrances of the part ducts with the cross-sectional surface of the free space (28) are of approximately equal size.

13. The arrangement for cooling as claimed in claim 7, wherein the fan is fastened in or on an orifice in a wall of a housing (1) which receives the board (2), together with the shield (3) and further mechanically operating components (4), and wherein the free space (28), not covered by the air guide duct (13), of the fan (5) serves for cooling said further components (4).

14. The arrangement for cooling as claimed in claim 12, wherein the fan is fastened in or on an orifice in a wall of a housing (1) which receives the board (2), together with the shield (3) and further mechanically operating components (4), and wherein the free space (28), not covered by the air guide duct (13), of the fan (5) serves for cooling said further components (4).

* * * * *